United States Patent [19]

Trümpler et al.

[11] Patent Number: 4,860,167
[45] Date of Patent: Aug. 22, 1989

[54] ELECTRICAL SWITCHING UNIT

[75] Inventors: Walter Trümpler, Karlsruhe; Josef Schmidt, Graben-Neudorf, both of Fed. Rep. of Germany

[73] Assignee: Sew-Eurodrive Gmbh & Co., Bruchsal, Fed. Rep. of Germany

[21] Appl. No.: 176,150

[22] Filed: Mar. 31, 1988

[30] Foreign Application Priority Data

Mar. 31, 1987 [DE] Fed. Rep. of Germany ... 8704572[U]

[51] Int. Cl.⁴ .............................................. H05K 7/02
[52] U.S. Cl. .................................... 361/417; 361/331; 361/419; 361/420; 363/125
[58] Field of Search ............. 174/52 R; 361/331, 380, 361/392–395, 399, 417, 419–420; 363/125

[56] References Cited

U.S. PATENT DOCUMENTS 4,039,900  8/1977  Roback et al. .................... 363/146
4,209,820  6/1980  Rundel et al. ...................... 361/331
4,573,104  2/1986  Kamada ............................. 361/394

Primary Examiner—A. D. Pellinen
Assistant Examiner—Gregory D. Thompson
Attorney, Agent, or Firm—Antonelli, Terry & Wands

[57] ABSTRACT

An electrical switching unit, such as a rectifier unit for an electromagnetic motor brake or the like is proposed having a base part and at least one top part, as well as a mounting plate carrying electronic components, in which a top part and the mounting plate are connected to an insertion unit insertible in the base part and that the top part is placed over the components on the mounting plate side provided with the components.

9 Claims, 1 Drawing Sheet

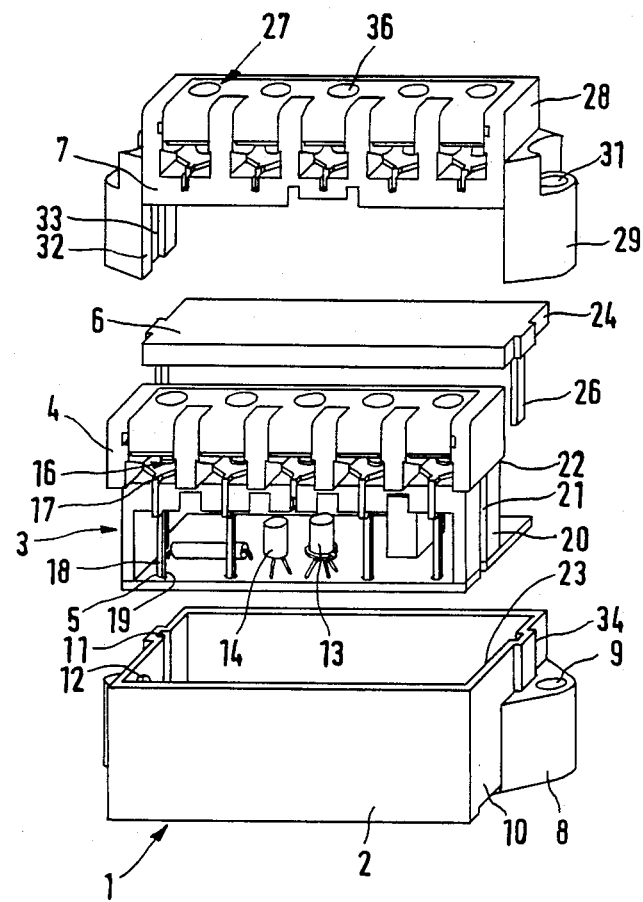

ELECTRICAL SWITCHING UNIT

TECHNICAL FIELD

The invention relates to an electrical switching unit, such as a rectifier unit for an electromagnetic motor brake or the like, with a base part and at least one top part, as well as a mounting plate carrying electronic components.

BACKGROUND ART

Numerous different constructions of such switching units are known. For example, it has been proposed to construct the electrical components in a casing base with a threaded lug, the insertion opening being closed by a cover. The casing base can e.g. be formed by a reducing piece and the cover is screwed on. Such a unit can be screwed to a conventional cable connection box by internally threaded cable bushings, the connections of the unit being passed through an externally threaded lug.

The problem of the invention is to construct such an electronic switching unit in compact manner integrated with connecting devices for the connection of external connection lines or leads, so that it can be used independently of separate connection boxes.

DISCLOSURE OF INVENTION

According to the invention this problem is solved in the case of an electrical switching unit, such as a rectifier unit for an electromagnetic motor brake or the like, with a base part and at least one top part, as well as a mounting plate carrying electronic components, in that a top part and the mounting plate are connected to an insertion unit insertible into the base part and that the top part is arranged over the components on the mounting plate side provided therewith. Whereas conventionally connecting devices, such as clips, are constructed in fixed form in the casing base, or in the case of constructing on a cover part the connections are conventionally arranged on the back surface remote from the side carrying the components, or possibly on front faces, according to the invention the components and the top part are arranged on the same side of the mounting plate and the top part bridges with an adequate spacing at least part of the components, so that the latter are not damaged. The connection and arrangement of the mounting plate and the top part in spaced manner can in particular be achieved in that the top part is connected to the mounting plate by means of contact feet extending well away from the top part and emanating from the connecting devices. Additionally the top part has spacers directed towards the mounting plate. In this construction the top part is kept adequately spaced from the mounting plate before the contact feet are fixed to the latter by soldering. Easy assembly of the matched parts is in particular achieved in that the base part and the insertion part have in their respective side walls guide grooves and tongues which are matched to one another, so that the base part and top part can be guided relative to one another on assembly.

According to a further preferred construction, the top part connected to the mounting plate only covers a portion of the insertion opening of the base part, whilst the remainder of the opening is covered by a separate top part and the mounting plate inserted in the base part, provided with components and connected to the top part is cast in the base part. Due to the fact that the top part does not cover the entire opening of the base part, the mounting plate and components can be inserted in the base part and subsequently a tight casting of the components can be carried out, which would not be possible in the case of a prior covering of the complete opening of the top part in the case of the inventive construction of the insertion unit. According to other constructions over the base part is placed an additional bridge-like contact strip with electrical connecting devices and that the mounting plate inserted in the base part, provided with components and connected to the top part is cast in the base part.

The invention leads to a compact switching unit comprising individual parts matched to one another in building block-like manner and which can easily be interconnected to form an overall unit. This applies both with respect to the use of the mounting plate and the top part associated therewith and the connection of the top parts to the base part, as well as the arrangement of the optionally additionally provided bridge-like contact strip.

Further advantages and features of the invention can be gathered from the description of a preferred, nonlimitative embodiment illustrated in the drawings

BRIEF DESCRIPTION OF DRAWING

The single drawing shows one embodiment of the invention in a perspective exploded form.

BEST MODE FOR CARRYING OUT THE INVENTION

The inventive switching unit 1 has a base part 2, an insertion unit 3 formed of a first top part 4 and a mounting plate 5 which are connected together and in the represented embodiment a further separate top part 6 and a contact strip 7. If the additional contact strip 7 is not required in the area where the switching unit is used, it can be omitted. If such an additional contact strip 7 is regularly used in the use area of the inventive switching unit 1, it can also be integrated and constructed in one piece with the further top part 6, so that there is no need for the latter as a separate part. In principle, there need only be one top part 4 extending over the entire opening of the base part 2, but the represented construction with two top parts 4, 6 offers advantages, which will be explained hereinafter.

The base part is externally provided with fastening lugs 8 with openings 9 for fixing the switching unit by means of screws. On opposite inner side walls, the base part 2 has grooves 11 and tongues 12, which cooperate with corresponding complementary constructions on the top parts 4, 6 for the placing thereof.

Mounting plate 5 has a surface corresponding to the base surface of the inner area of base part 2, so that it can be inserted therein. On the top of mounting plate 5 facing top part 4 are arranged electrical components 13, 14, only some of which are shown in exemplified manner in the drawing.

The top part is constructed as a connection block and is provided with terminals 16 in depressions for the connection of connecting lines or leads. Terminals 16 are each provided with a lower contact plate 17 with a screw threaded aperture. An upper contact plate (not shown) is pressed against each lower contact plate by a screw which is screwed in the threaded aperture in the lower contact plate, so that the bare end of a lead is fastened between the two contact plates. Thus, the terminals 16 and cooperating contact plates 17 form connecting devices for fastening the ends of leads. A contact foot 18 is constructed in one piece with the lower contact plate 17 and is guided towards the bottom surface of top part 4 and extends from there vertically over a considerable distance until its end 19 passes through a corresponding contact opening in mounting plate 5, where it is soldered thereto or to a printed conductor applied thereto.

In the represented embodiment top part 4 has a total of five connection points and corresponding contact feet 18 lead from four of the connection points to the mounting plate 5, whilst the contact foot at the central point is cut off and is not in contact with the components 13, 14 on the mounting plate, the central connection point serves merely as a terminal for the connection of two lines.

In the represented embodiment, the two end faces of top part 4 are provided with spacers 20 extending therefrom to the mounting plate keeping the clamping area of part 4 at a distance from mounting plate 5 corresponding to its height and in particular at the time of manufacture. After soldering the contact feet 18 to mounting plate 5, this also leads to the maintaining of the necessary spacing. In the represented embodiment, the spacers 20 have in the side wall in each case a groove 21, which cooperates with the tongue 12 of base part 2 for the accurate fitting insertion of insertion unit 3 in base part 2. On their end faces the top parts 4 are laterally provided with shoulders 22 projecting over spacers 20 and by means of which they rest on an upper edge 23 of the corresponding side walls 10 of base part 2.

Top part 6 is substantially planar and is provided on its end faces 24 with lugs 26 extending vertically from its main face by means of which it engages in groove 11 of the base part 2 for the purpose of accurate positioning.

The additional contact strip 7 with regards to the construction of its connections for the connecting fo leads has a similar construction to the corresponding connections of top part 4. It also have five supports 27 with two clamping plates, which can in each case be braced by means of a screw and whilst interposing the bare end of a connecting lead. In this way it is possible to connect a floorstanding heating system or the like in readily visible manner and such as has hitherto taken place with freely suspended procelain insulators. Contact strip 7 bridges base part 2 and is provied on its end faces 28 with fastening feet 29, which are constructed in similar manner to the fixing lugs 8 of base part 2 and also have an opening 31 for receiving a screw. On their inside 32, the fixing lugs 29 have in each case one groove 33, which cooperates with a shoulder 34 located on the outside of side wall 10 of base part 2 and which runs parallel to groove 11, in order to fix the contact strip in accurately fitting manner to base part 2, so that opening 31 is aligned with the base part opening 9.

The connection parts of contact strip 7 and top part 4 are secured by a clamping strip (not shown), which is itself fixed by detents to part 4 or 7 and which covers the contact plates 17 whilst leaving the openings exposed, so that a screwdriver can act on the screwheads.

Firstly the electrical components are placed on mounting plate 5, followed by the top part 4 and, as stated, the contact feet 18 are passed through corresponding openings in the mounting plate. The components and contact feet 18 are then respectively soldered to respective printed conductors of the mounting plates.

Insertion unit 3 is then inserted in base part 2. Due to the fact that in the represented embodiment top part 4 does not cover the entire opening of base part 2 and instead only covers part thereof, it is possible to subsequently cast components 13, 14. Only then, in the case of the present embodiment, is the second top part 6 placed on the hitherto left free open part of base part 2 and the top parts are tightly connected to base part 2, e.g. by bonding round the circumferential edge and optionally by welding if the casing materials permit this. If desired, on the apparatus to be provided with the switching unit, the contact strip is placed on base part 2 in the area over top part 6 and both are fixed by means of screws to the corresponding apparatus.

We claim:

1. Electrical switching unit, such as a rectifier unit for an electromagnetic motor brake or the like, comprising a base part and a top part, as well as a mounting plate carrying electronic components, wherein the top part and the mounting plate are connected together as an insertion unit to be inserted in the base part and the top part is arranged over the electronic components on the side of the mounting plate provided with the electronic components, said top part is connected to the mounting plate by means of contact feet extending well away from the top part and emanating from connecting devices on said insertion unit.

2. Unit according to claim 1, wherein the top part has spacers directed towards the mounting plate.

3. Unit according to claim 1, wherein the base part and insertion unit have respective ones of guide grooves and tongues matched to one another in respective side walls thereof.

4. Unit according to claim 1, wherein the mounting plate rests nearly on the bottom of the base part and the components extend upwards.

5. Electrical switching unit, such as a rectifier unit for an electromagnetic motor brake or the like, comprising a base part and a top part, as well as a mounting plate carrying electronic components, wherein the top part and the mounting plate are connected together as an insertion unit to be inserted in an insertion opening of the base part and the top part is arranged over the electronic components on the side of the mounting plate provided with the electronic components, and wherein the top part connected to the mounting plate only covers part of the insertion opening of the base part, while the remainder of the opening is covered by a separate top part.

6. Unit according to claim 5, wherein the components on the mounting plate inserted in the base part, provided with components and connected to the top part are potted while in the base part.

7. Electrical switch unit, such as a rectifier unit for an electromagnetic motor brake or the like, comprising a base part and a top part, as well as a mounting plate carrying electronic components, wherein the top part and the mounting plate are connected together as an insertion unit to be inserted in the base part and the top part is arranged over the electronic components on the side of the mounting plate provided with the electronic components and further comprising a bridge-like contact strip with electrical connecting devices, which is provided over the base part and insertion unit.

8. Unit according to claim 7, wherein the contact strip is fixed to the base part.

9. Electrical switching unit, such as a rectifier unit for an electromagnetic motor brake or the like, comprising a base part and a top part, as well as a mounting plate carrying electroic components, wherein the top part and the mounting plate are connected together as an insertion unit to be inserted in the base part and the top part is arranged over the electronic components on the side of the mounting plate provided with the electronic components, the insertion unit having connecting devices, and wherein at least the top part of the insertion unit is constructed as a strip.

* * * * *